US011764744B2

(12) United States Patent
Jo et al.

(10) Patent No.: US 11,764,744 B2
(45) Date of Patent: Sep. 19, 2023

(54) DISTRIBUTED CIRCUIT

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 71 days.

(21) Appl. No.: 17/598,379

(22) PCT Filed: Mar. 13, 2020

(86) PCT No.: PCT/JP2020/011103
§ 371 (c)(1),
(2) Date: Sep. 27, 2021

(87) PCT Pub. No.: WO2020/203182
PCT Pub. Date: Oct. 8, 2020

(65) Prior Publication Data
US 2022/0123702 A1    Apr. 21, 2022

(30) Foreign Application Priority Data

Mar. 29, 2019 (JP) .................................. 2019-065715

(51) Int. Cl.
*H03F 3/60* (2006.01)
*H03F 1/22* (2006.01)
*H03D 7/12* (2006.01)

(52) U.S. Cl.
CPC ............... *H03F 3/605* (2013.01); *H03D 7/12* (2013.01)

(58) Field of Classification Search
CPC ...... H03F 3/605; H03F 2200/451; H03F 1/18; H03F 1/22; H03D 7/12; H03D 2200/0019; H03D 7/1433; H03D 7/1458
(Continued)

(56) References Cited

U.S. PATENT DOCUMENTS 7,782,140 B2 *  8/2010  Shigematsu ......... H03B 5/1228
330/54
2002/0130720 A1 *  9/2002  Pavio ..................... H03F 3/607
330/311

(Continued)

FOREIGN PATENT DOCUMENTS

WO    2007049391 A1    5/2007
WO    2007108103 A1    9/2007

OTHER PUBLICATIONS

Kobayashi, K. et al., "A Novel HBT Distributed Amplifier Design Topology Based on Attenuation Compensation Tehniques," IEEE Transactions on Microwave Theory and Techniques, vol. 42, No. 12, Dec. 1994, 7 pages.

(Continued)

*Primary Examiner* — Hieu P Nguyen
(74) *Attorney, Agent, or Firm* — Slater Matsil, LLP (57) ABSTRACT

A distributed amplifier includes a first transmission line for input, a second transmission line for output, an input termination resistor connecting a line end of the first transmission line and a power supply voltage, an output termination resistor connecting an input end of the second transmission line and a ground, unit cells having input terminals connected to the first transmission line and output terminals connected to the second transmission line, and a bias tee configured to supply a bias voltage to an input transistor of each of the unit cells. An emitter or source resistor of the input transistor of each of the unit cells is set to a different resistance value from each other in order for a collector or (Continued)

drain current flowing through the input transistor of each of the unit cells to have a uniform value.

14 Claims, 12 Drawing Sheets

(58) Field of Classification Search
USPC .......................................... 330/286, 295, 54
See application file for complete search history.

(56) References Cited

U.S. PATENT DOCUMENTS

2009/0009253 A1    1/2009    Shigematsu
2009/0231043 A1    9/2009    Suzuki

OTHER PUBLICATIONS

Masuda, S. et al., "An Over-110-GHz InP HEMT Flip-Chip Distributed Baseband Amplifier With Inverted Microstrip Line Structure for Optical Transmission System," IEEE Journal of Solid-State Circuits, vol. 38, No. 9, Sep. 2003, 6 pages.

* cited by examiner

DISTRIBUTED CIRCUIT

This patent application is a national phase filing under section 371 of PCT/JP2020/011103, filed Mar. 13, 2020, which claims the priority of Japanese patent application no. 2019-065715, filed Mar. 29, 2019, each of which is incorporated herein by reference in its entirety.

TECHNICAL FIELD

The present invention relates to a distributed circuit such as a distributed amplifier or a distributed mixer.

BACKGROUND

Distributed circuits such as distributed mixers and distributed amplifiers have excellent wideband characteristics and are used in various systems related to high speed optical communication, high resolution radars, etc. The distributed circuits are capable of amplifying and mixing signals over a wide band of frequencies by achieving impedance matching in a condition where parasitic capacitors of transistors are incorporated into transmission lines for input and output and by matching propagation constants of a transmission line for input and that for output.

Figure 9:
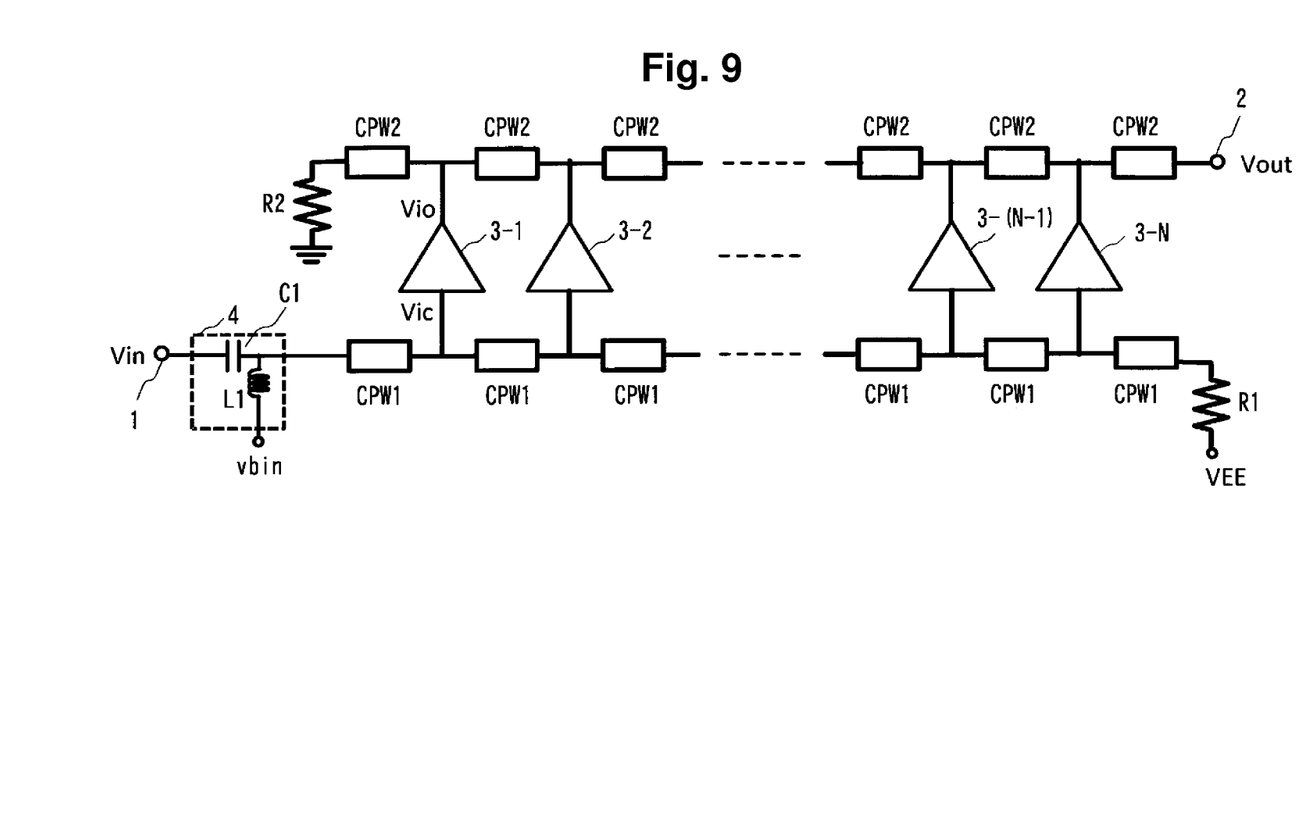
FIG. 9 is a circuit diagram showing a configuration of a conventional distributed amplifier using a bias tee.

Causing the distributed circuits to operate properly requires appropriate currents (collector currents for bipolar transistors, drain currents for field effect transistors) flowing through respective transistors used. FIG. 9 is a circuit diagram showing a configuration of a conventional distributed amplifier. The distributed amplifier includes: a transmission line CPW1 for input, the transmission line CPW1 having an input end connected to a signal input terminal 1; a transmission line CPW2 for output, the transmission line CPW2 having a line end connected to a signal output terminal 2; an input termination resistor R1 connecting a line end of the transmission line CPW1 and a power supply voltage VEE; an output termination resistor R2 connecting an input end of the transmission line CPW2 and a ground; a plurality of unit cells 3-1 to 3-N arranged along the transmission lines CPW1 and CPW2, the unit cells having input terminals connected to the transmission line CPW1 and output terminals connected to the transmission line CPW2; and a bias tee 4 configured to supply a bias voltage to an input transistor of each of the unit cells 3-1 to 3-N. In the example of FIG. 9, unit cells 3 (3-1 to 3-N) are provided in N stages.

Figure 10:
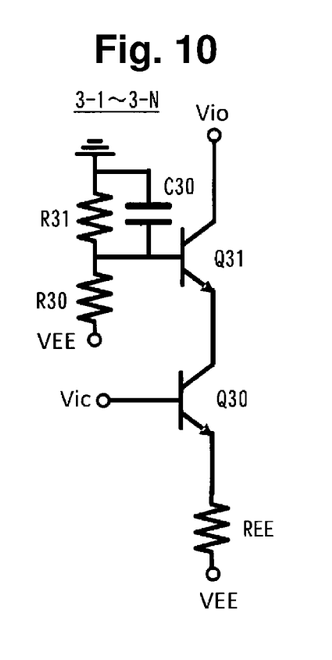
FIG. 10 is a circuit diagram showing a configuration of a unit cell of a distributed amplifier in FIG. 9.

As shown in FIG. 10, each of the unit cells 3 (3-1 to 3-N) includes: an input transistor Q30 having a base terminal connected to the transmission line CPW1; an output transistor Q31 having a collector terminal connected to the transmission line CPW2 and an emitter terminal connected to a collector terminal of the input transistor Q30; an emitter resistor REE having one end connected to an emitter terminal of the input transistor Q30 and the other end connected to the power supply voltage VEE; a resistor R30 having one end connected to the power supply voltage VEE and the other end connected to a base terminal of the output transistor Q2; a resistor R31 having one end connected to the base terminal of the output transistor Q2 and the other end connected to the ground; and a capacitor C30 having one end connected to the base terminal of the output transistor Q2 and the other end connected to the ground.

As shown in FIG. 9, the bias tee 4 includes: a capacitor C1 disposed between the signal input terminal 1 and the input end of the transmission line CPW1; and an inductor L1 having one end connected to the input end of the transmission line CPW1 and the other end connected to a bias voltage vbin.

In a distributed amplifier realized by an integrated circuit (IC) as shown in FIG. 9, for example, causing a proper current to flow through the transistors Q30 and Q31 of each of the unit cells 3 requires delivering an appropriate bias voltage to the base terminal of the input transistor Q30 of each of the unit cells 3. When the bias voltage for the input transistor Q30 is applied, a bias tee 4 (which is off-chip) for blocking a dc voltage can be used so as to eliminate the effect of the dc voltage of a circuit in a previous stage (see Non-Patent Literature 1).

Figure 11:
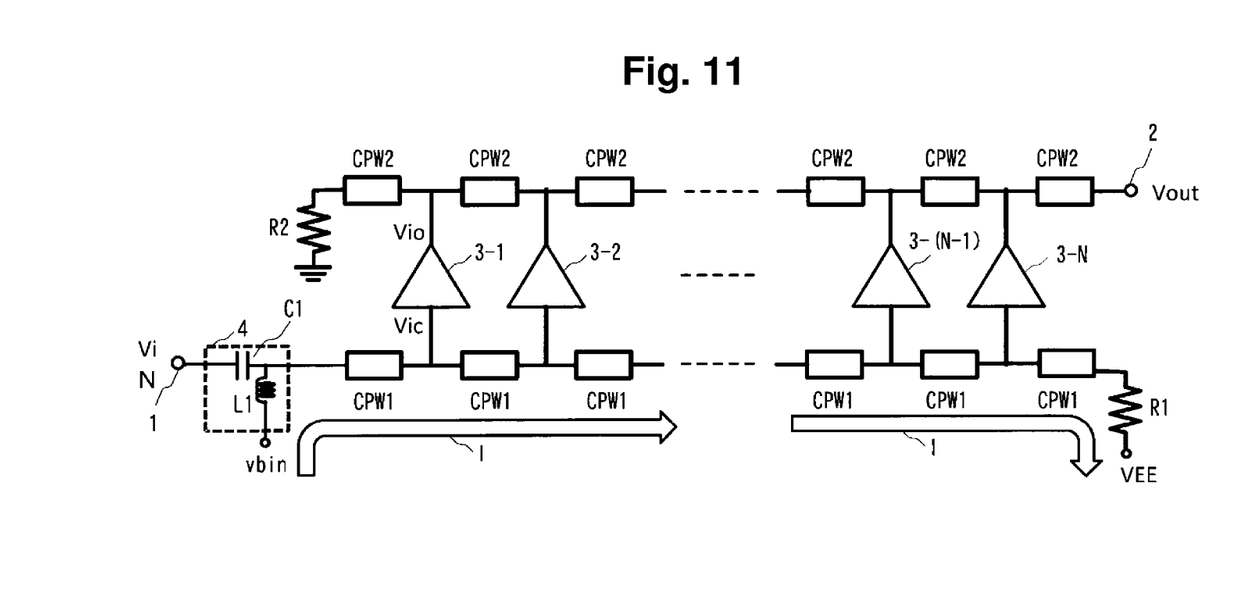
FIG. 11 is a diagram for describing a problem of the conventional distributed amplifier using the bias tee.

With use of the bias tee 4, however, there is a problem of a gain reduction of an amplifier resulting from a current flowing from the inductor L1 to the input termination resistor R1. This phenomenon can be described as follows. Since the transmission lines CPW1 and CPW2 have small resistances, a voltage drop occurs due to a current I flowing from the inductor L1 of the bias tee 4 toward the input termination resistor R1 through the transmission line CPW1 as shown in FIG. 11. The voltage drop causes the voltage difference between the bias tee 4 and the input termination resistor R1.

Figure 12:
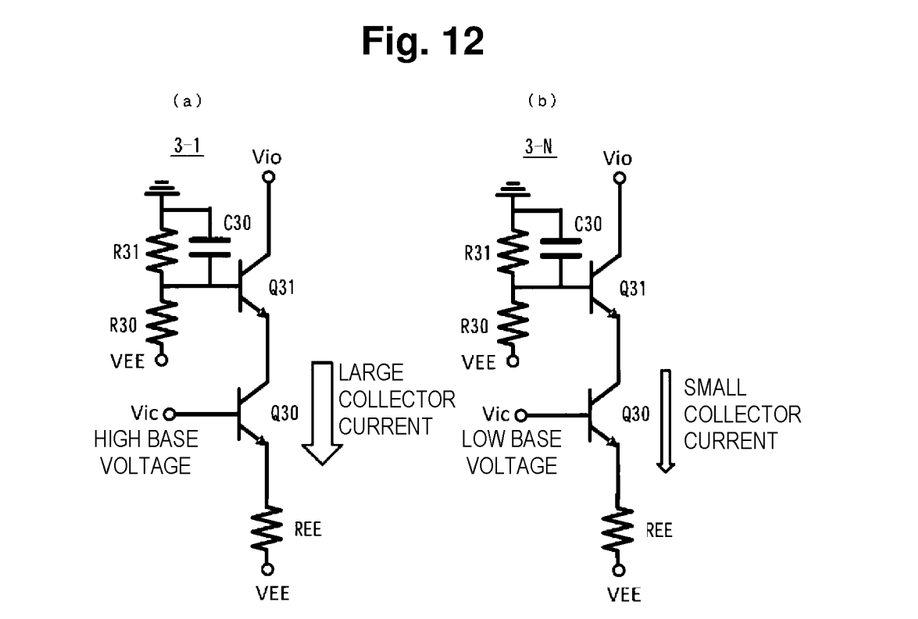
FIG. 12 is a diagram for describing a problem of the conventional distributed amplifier using the bias tee.

In each of the unit cells 3, a collector current flows through the input transistor Q30 as shown in (a) and (b) of FIG. 12, while the voltage difference between the bias tee 4 and the input termination resistor R1 causes a base voltage Vic of the input transistor Q30 of each of the unit cells 3 to have a non-uniform value, thereby also causing the collector current to have a non-uniform value. In the examples (a) and (b) of FIG. 12, a collector current flowing through the input transistor Q30 of the unit cell 3-1 in a first stage is larger than a collector current flowing through the input transistor Q30 of the unit cell 3-N in an N-th stage.

On the other hand, there is an optimal value of a collector current to achieve the maximum gain of a transistor. However, since the collector current has a non-uniform value as described above, a value of a collector current is farther from the optimal value as a corresponding unit cell is closer to a line end, so that there is a problem of a gain reduction of the conventional distributed amplifier.

To solve the problem, several solutions have been proposed. For example, Non-Patent Literature 2 discloses a solution in which a capacitor is disposed in series with the input termination resistor R1 to block a direct current. However, in the solution disclosed in Non-Patent Literature 2, the disposed capacitor having a small capacitance value deteriorates reflection characteristics at low frequencies, thereby requiring a large capacitance value. However, since a large capacitance value cannot be realized by an on-chip configuration, the solution disclosed in Non-Patent Literature 2 is unable to be applied to the amplification of baseband signals that require better reflection characteristics over a range from low frequency.

To solve the problem of the gain reduction, there may also be a solution to improve the reflection characteristics at low frequencies by pulling one terminal of the input termination resistor R1 out of a chip to connect the terminal in series with an off-chip capacitor capable of having a large capacitance value. However, pulling one terminal of the input termination resistor R1 out of the chip requires a long wiring. The long wiring is equivalent to a large inductance connecting the input termination resistor R1 and the off-chip capacitor, thus deteriorating reflection characteristics at high frequencies. Accordingly, the solution using the off-chip capacitor cannot be applied to the amplification of wideband baseband signals.

As described above, there has been a problem that it is difficult to eliminate a gain reduction of an amplifier due to a non-uniform collector current while maintaining better reflection characteristics. This problem occurs not only in an amplifier but also in a distributed mixer using a bias tee as shown in FIGS. 13 and 14, thus causing a reduction in conversion gain.

The distributed mixer includes: a transmission line CPW1 having an input end connected to a signal input terminal (intermediate frequency (IF) terminal) 1; transmission lines CPW2$p$ and CPW2$n$ configured to output radio frequency (RF) signals, the transmission lines having line ends connected to signal output terminals 2$p$ and 2$n$; transmission lines CPW3$p$ and CPW3$n$ configured to receive local oscillator (LO) signals; an input terminal resistor R1 connecting a line end of the transmission line CPW1 and a power supply voltage VEE; output termination resistors R2$p$ and R2$n$ connecting input ends of the transmission lines CPW2$p$ and CPW2$n$ and a ground; output termination resistors R3$p$ and R3$n$ connecting line ends of the transmission lines CPW3$p$ and CPW3$n$ and a bias voltage vblo; a plurality of unit cells 5-1 to 5-N arranged along the transmission lines CPW1, CPW2$p$, CPW2$n$, CPW3$p$ and CPW3$n$, the unit cells having IF input terminals connected to the transmission line CPW1, LO input terminals connected to the transmission lines CPW3$p$ and CPW3$n$, and RF output terminals connected to the transmission lines CPW2$p$ and CPW2$n$; a bias tee 4 configured to supply a bias voltage to an input transistor of each of the unit cells 5-1 to 5-N; and a branch waveguide 6 configured to branch the LO signal into two LO signals and apply the branched LO signals to input ends of the transmission lines CPW3$p$ and CPW3$n$.

Figure 14:
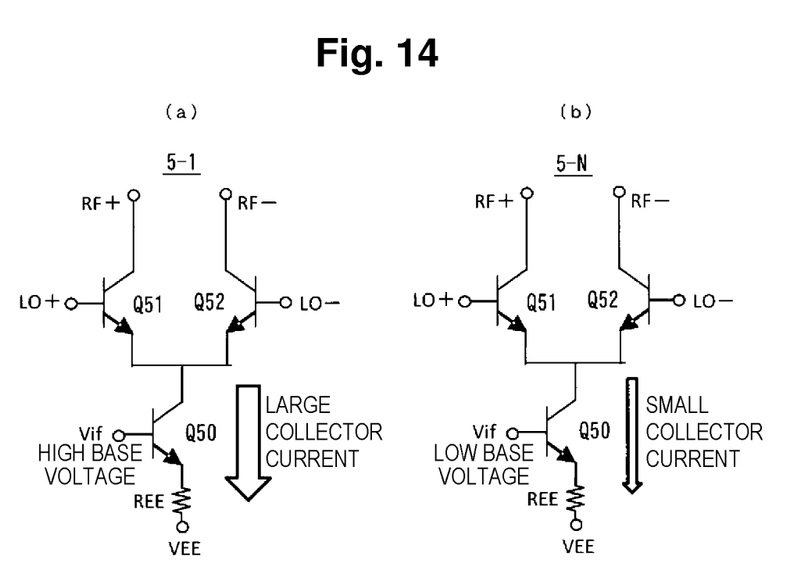
FIG. 14 is a diagram for describing the problem of a conventional distributed mixer using a bias tee.

As shown FIG. 14, each of the unit cells 5 (5-1 to 5-N) includes: an input transistor Q50 having a base terminal connected to the transmission line CPW1; output transistors Q51 and Q52 having base terminals connected to the transmission lines CPW3$p$ and CPW3$n$, collector terminals connected to the transmission lines CPW2$p$ and CPW2$n$, and emitter terminals connected to a collector terminal of the transistor Q50; and an emitter resistor REE having one end connected to an emitter terminal of the input transistor Q50 and the other end connected to a power supply voltage VEE.

Figure 13:
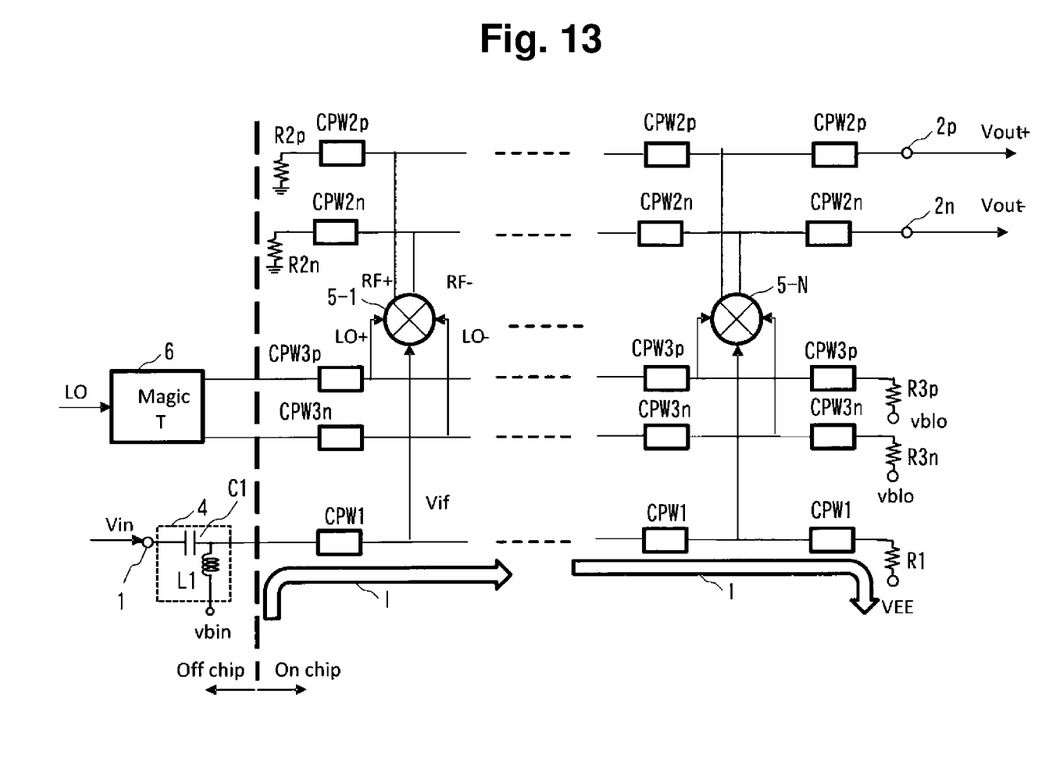
FIG. 13 is a diagram for describing the problem of a conventional distributed mixer using a bias tee.

Also, in the configuration shown in FIG. 13, the voltage difference between the bias tee 4 and the input termination resistor R1 causes a base voltage Vif of the input transistor Q50 of each of the unit cells 5 to have a non-uniform value, thereby also causing a collector current to have a non-uniform value. In the examples (a) and (b) of FIG. 14, a collector current flowing through the input transistor Q50 of the unit cell 5-1 in a first stage is larger than a collector current flowing through the input transistor Q50 of the unit cell 5-N in an N-th stage.

CITATION LIST

Non-Patent Literature

Non-Patent Literature 1: Satoshi Masuda, Tsuyoshi Takahashi, and Kazukiyo Joshin, "An over-110-GHz InP HEMT flip-chip distributed baseband amplifier with inverted microstrip line structure for optical transmission system", IEEE Journal of Solid-State Circuits, Vol. 38, No. 9, pp. 1479-1484, 2003.

Non-Patent Literature 2: Kevin W. Kobayashi, Reza Esfandiari, and Aaron K. Oki, "A novel HBT distributed amplifier design topology based on attenuation compensation techniques", IEEE transactions on microwave theory and techniques, Vol. 42, No. 12, pp. 2583-2589, 1994.

SUMMARY

Technical Problem

Embodiments of the present invention can solve the above problems, and an embodiment of the present invention provides a distributed circuit capable of improving a gain as compared with the prior art.

Means for Solving the Problem

A distributed circuit according to embodiments of the present invention includes: a first transmission line configured to receive an input signal at an input end; a second transmission line configured to output an output signal from an output end; a termination resistor connected to a line end of the first transmission line; a plurality of unit cells arranged along the first and second transmission lines, the unit cells having input terminals connected to the first transmission line and output terminals connected to the second transmission line; and a bias tee connected to the input end of the first transmission line, the bias tee configured to supply a bias voltage to an input transistor of each of the unit cells, wherein the unit cell at least comprises: the input transistor having a base or gate terminal connected to the first transmission line; and an emitter or source resistor connected to an emitter or source terminal of the input transistor, and the emitter or source resistor of each of the unit cells is set to a different resistance value from each other in order for a collector or drain current flowing through the input transistor of each of the unit cells to have a uniform value.

In an exemplary configuration of the distributed circuit according to embodiments of the present invention, when a current flows from the bias tee toward the termination resistor through the first transmission line, the emitter or source resistor of each of the unit cells is set to a larger resistance value as the corresponding unit cell is closer to the bias tee and to a smaller resistance value as the corresponding unit cell is closer to the termination resistor.

In an exemplary configuration of the distributed circuit according to embodiments of the present invention, when a current flows from the termination resistor toward the bias tee through the first transmission line, the emitter or source resistor of each of the unit cells is set to a smaller resistance value as the corresponding unit cell is closer to the bias tee and to a larger resistance value as the corresponding unit cell is closer to the termination resistor.

In an exemplary configuration of the distributed circuit according to embodiments of the present invention, the unit cell includes: the input transistor having the base or gate terminal connected to the first transmission line; the emitter or source resister having one end connected to the emitter or source terminal of the input transistor and the other end connected to a first voltage; and an output transistor having a base or gate terminal connected to a second voltage, a collector or drain terminal connected to the second transmission line, and an emitter or source terminal connected to the collector or drain terminal of the input transistor, and the distributed circuit is configured to operate as a distributed amplifier.

In an exemplary configuration of the distributed circuit according to embodiments of the present invention, the input signal is an IF signal and the output signal is an RF signal, the distributed circuit further includes a third transmission line configured to receive an LO signal at an input end, and the unit cell includes: the input transistor having the base or gate terminal connected to the first transmission line; an output transistor having a base or gate terminal connected to the third transmission line, a collector or drain terminal connected to the second transmission line, and an emitter or source terminal connected to the collector or drain terminal of the input transistor; and the emitter or source resister having one end connected to the emitter or source terminal of the input transistor and the other end connected to a first voltage, and the distributed circuit is configured to operate as a distributed mixer.

In an exemplary configuration of the distributed circuit according to embodiments of the present invention, the bias tee includes: a capacitor having one end for receiving the input signal and the other end connected to the input end of the first transmission line; and an inductor having one end connected to the input end of the first transmission line and the other end connected to a third voltage.

Effects of Embodiments of the Invention

According to embodiments of the present invention, the gain of the distributed circuit can be improved by setting the emitter or source resistor of each of the unit cells to a different resistance value from each other in order for the collector or drain current flowing through the input transistor of each of the unit cells to have a uniform value.

DETAILED DESCRIPTION OF ILLUSTRATIVE EMBODIMENTS

In embodiments of the present invention, an emitter resistor of each of a plurality of unit cells is set, in order for a collector current of each of the unit cells to have a uniform value, not to the same resistance value but to a larger resistance value as the corresponding unit cell is closer to a bias tee and to a smaller resistance value as the corresponding unit cell is closer to an input termination resistor. This makes the collector current of the unit cell more difficult to flow as the unit cell is closer to the bias tee, and easier to flow as the unit cell is closer to the input termination resistor. Therefore, in embodiments of the present invention, setting the emitter resistor of each of the unit cells to an appropriate resistance value allows the collector currents of all the unit cells to have uniform values.

According to embodiments of the present invention, a collector current of each of unit cells, though the collector current has a non-uniform value in the prior art, can be compensated to have the same value, and a gain of a circuit can be improved.

First Embodiment

Embodiments of the present invention will be described below with reference to the drawings.

Figure 1:
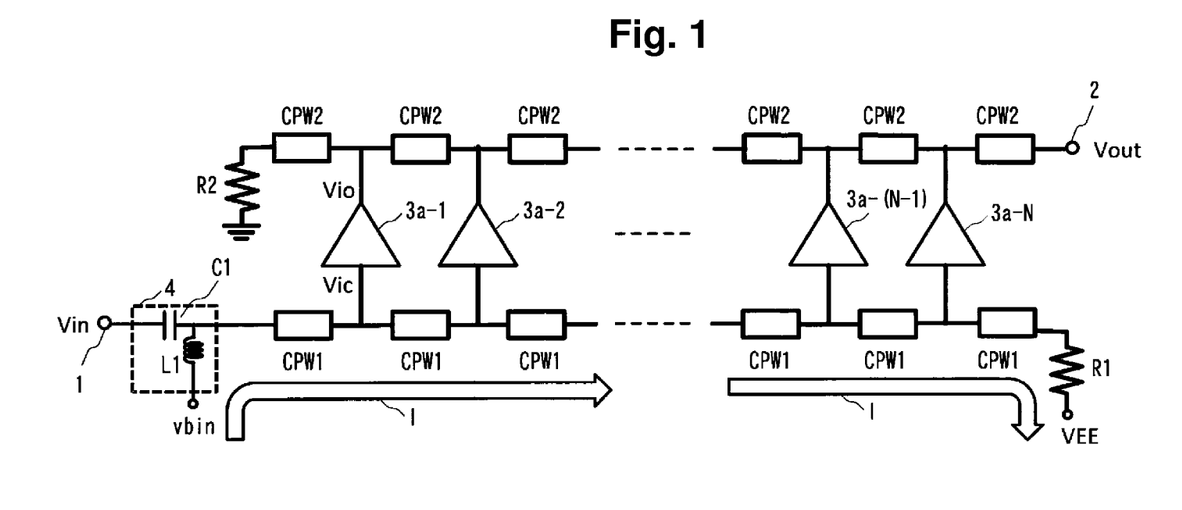
FIG. 1 is a circuit diagram showing a configuration of a distributed amplifier according to a first embodiment of the present invention.

FIG. 1 is a circuit diagram showing a configuration of a distributed amplifier according to a first embodiment of the present invention. The distributed amplifier of the present embodiment includes a transmission line CPW1 for input, a transmission line CPW2 for output, an input termination resistor R1, an output termination resistor R2, a plurality of unit cells 3*a*-1 to 3*a*-N, and a bias tee 4. Here, the transmission line CPW1 has an input end connected to a signal input terminal 1. The transmission line CPW2 has a line end connected to a signal output terminal 2. The input termination resistor R1 connects a line end of the transmission line CPW1 and a power supply voltage VEE (first voltage). The output termination resistor R2 connects an input end of the transmission line CPW2 and a ground. The unit cells 3*a*-1 to 3*a*-N are arranged along the transmission lines CPW1 and CPW2, and each of the unit cells has an input terminal connected to the transmission line CPW1 and an output terminal connected to the transmission line CPW2. The bias tee 4 supplies a bias voltage to an input transistor of each of the unit cells 3*a*-1 to 3*a*-N.

In an example of FIG. 1, the unit cells 3*a* (3*a*-1 to 3*a*-N) are provided in N stages (N is an integer greater than or equal to two). In FIG. 1, Vin denotes an input signal of the distributed amplifier, Vout denotes an output signal of the distributed amplifier, Vic denotes an input signal of the unit cell 3*a* (a base voltage of the input transistor), and Vio denotes an output signal of the unit cell 3*a*.

Figure 2:
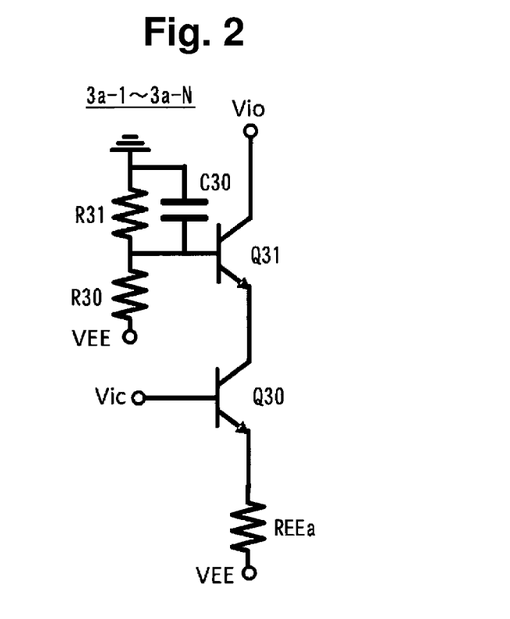
FIG. 2 is a circuit diagram showing a configuration of a unit cell of the distributed amplifier according to the first embodiment of the present invention.

As shown in FIG. 2, each of the unit cells 3*a* (3*a*-1 to 3*a*-N) includes an input transistor Q30, an output transistor Q31, an emitter resistor REEa, a resistor R30, a resistor R31, and a capacitor C30.

Here, the input transistor Q30 has a base terminal connected to the transmission line CPW1.

The output transistor Q31 has a collector terminal connected to the transmission line CPW2 and an emitter terminal connected to a collector terminal of the input transistor Q30. The emitter resistor REEa has one end connected to an emitter terminal of the input transistor Q30 and the other end connected to the power supply voltage VEE. The resistor R30 has one end connected to the power supply voltage VEE and the other end connected to a base terminal of the output transistor Q2. The resistor R31 has one end connected to the base terminal of the output transistor Q2 and the other end connected to the ground. The capacitor C30 has one end connected to the base terminal of output transistor Q2 and the other end connected to the ground. The output transistor Q31 has a gate terminal whose direct current potential (second voltage) is set to a voltage higher than the power supply voltage VEE (a voltage within a range from the ground voltage to the power supply voltage VEE in the present embodiment).

The bias tee 4 includes, as shown in FIG. 1, a capacitor C1 disposed between the signal input terminal 1 and the input end of the transmission line CPW1, and an inductor L1 having one end connected to the input end of the transmission line CPW1 and the other end connected to a bias voltage vbin (third voltage).

In the conventional distributed amplifier, as described above, the emitter resistor REE of the input transistor Q30 of each of the unit cells 3 has the same resistance value. On the other hand, in the present embodiment, the emitter resistor REEa of the input transistor Q30 of each of the unit cells 3*a* is set, in order for a collector current of each of the unit cells 3*a* to have a uniform value, to a different resistance value from each other, specifically, to a larger resistance value as the corresponding unit cell is closer to the bias tee 4 and to a smaller resistance value as the corresponding unit cell is closer to the input termination resistor R1.

Figure 3:
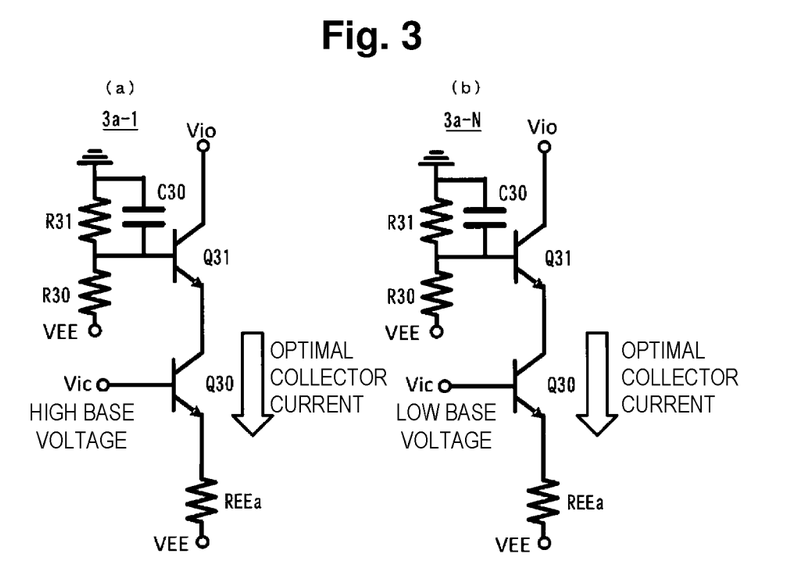
FIG. 3 is a diagram for describing an effect of the distributed amplifier according to the first embodiment of the present invention.

This allows, even if the base voltages Vic of the input transistors Q30 of the unit cells 3*a* have non-uniform values as shown in examples (a) and (b) of FIG. 3, the collector current flowing through the input transistor Q30 of each of the unit cells 3*a* to have an almost same value, and hence the collector current flowing through the input transistor Q30 of each of the unit cells 3*a* can be set to have an optimal value.

The present inventors simulated the conventional distributed amplifier shown in FIGS. 9 and 10 and the distributed amplifier of the present embodiment shown in FIGS. 1 and 2. Here, N=6 was set for both the conventional and present embodiments. All the unit cells 3 (3-1 to 3-6) of the conventional distributed amplifier include the emitter resistors REE of 15Ω. On the other hand, the distributed amplifier of the present embodiment includes, in order from closest to the bias tee 4, the emitter resistors REEa having resistance values of: 15Ω for the unit cell 3*a*-1 in a first stage; 14Ω for the unit cell 3*a*-2 in a second stage; 13Ω for the unit cell 3*a*-3 in a third stage; 14Ω for the unit cell 3*a*-4 in a fourth stage; 11Ω for the unit cell 3*a*-5 in a fifth stage; and 10Ω for the unit cell 3*a*-6 in a sixth stage.

In the conventional distributed amplifier, the collector current of the unit cell 3-6 in the sixth stage is 20% smaller than that of the unit cell 3-1 in the first stage. On the other hand, in the distributed amplifier of the present embodiment, the differences in the collector currents among all the unit cells fall within 1%.

Figure 4:
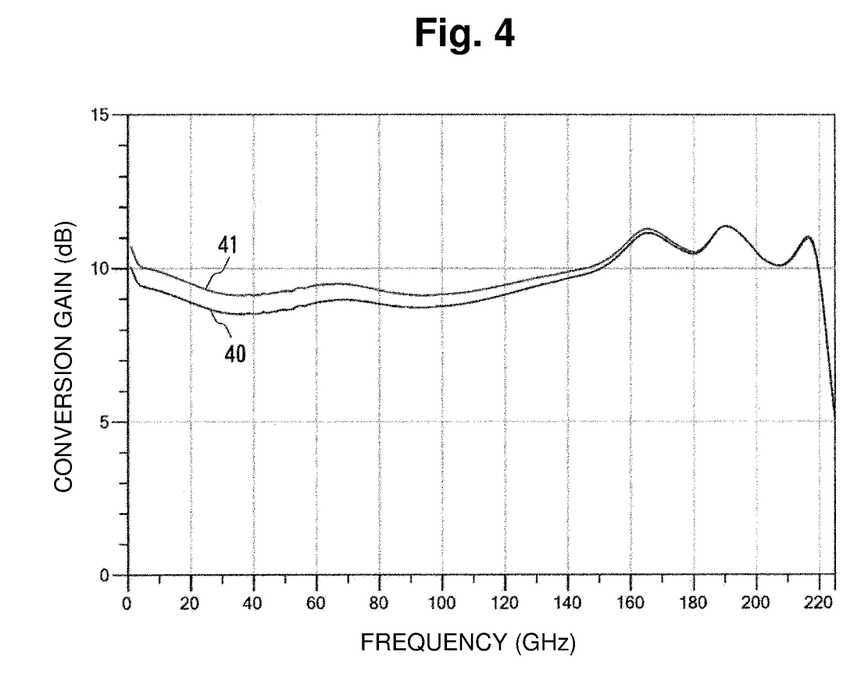
FIG. 4 is a diagram showing simulation results of gains of distributed amplifiers according to the prior art and the first embodiment of the present invention.

FIG. 4 shows the simulation results of gains (S21) of the distributed amplifiers of the conventional and present embodiments. In FIG. 4, reference numeral 40 denotes the gain of the conventional distributed amplifier, and reference numeral 41 denotes the gain of the distributed amplifier of the present embodiment. The conventional distributed amplifier has the gain of 8.8 dB at 20 GHz, but the distributed amplifier of the present embodiment is able to have the gain improved to 9.5 dB.

Second Embodiment

Figure 5:
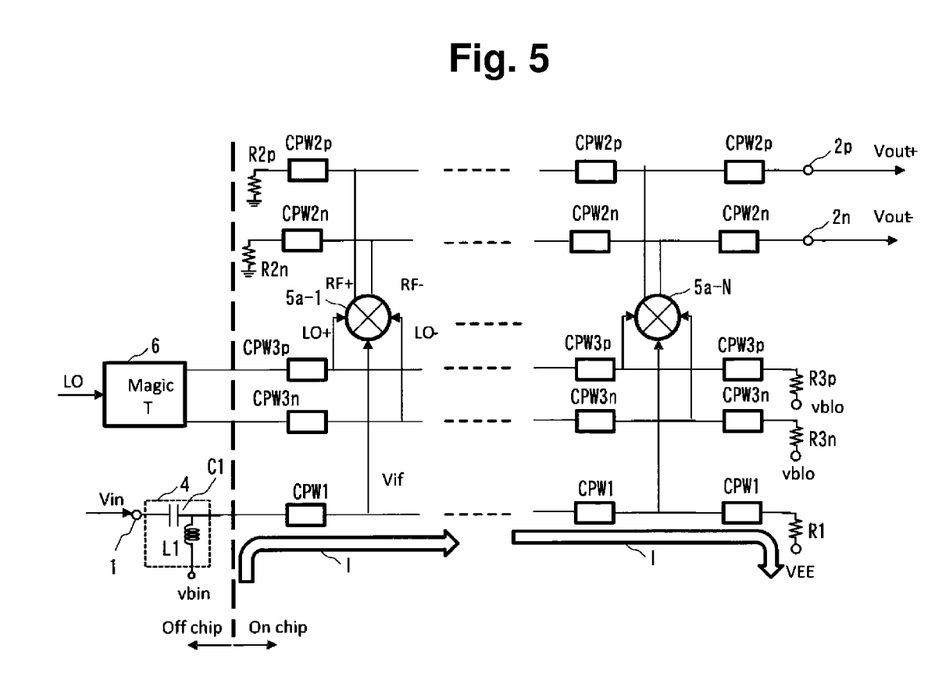
FIG. 5 is a circuit diagram showing a configuration of a distributed mixer according to a second embodiment of the present invention.

Next, a second embodiment of the present invention will be described with reference to the drawings. FIG. 5 is a circuit diagram showing a configuration of a distributed mixer according to the second embodiment of the present invention. The distributed mixer of the present embodiment includes: a transmission line CPW1; transmission lines CPW2*p* and CPW2*n* configured to output radio frequency (RF) signals; transmission lines CPW3*p* and CPW3*n* configured to receive local oscillator (LO) signals; an input termination resistor R1; output termination resistors R2*p* and R2*n*; termination resistors R3*p* and R3*n*; and the following components being described below: a plurality of unit cells 5*a*-1 to 5*a*-N; a bias tee 4; and a branch waveguide 6. Here, the transmission line CPW1 has an input end connected to a signal input terminal (IF terminal) 1. The transmission lines CPW2*p* and CPW2*n* have line ends connected to signal output terminals (RF terminals) 2*p* and 2*n*. The input termination resistor R1 connects a line end of the transmission line CPW1 and a power supply voltage VEE. The output termination resistors R2*p* and R2*n* connect an input end of the transmission line CPW2*p* and CPW2*n* and a ground. The output termination resistors R3*p* and R3*n* connect a bias voltage vblo and line ends of the transmission lines CPW3*p* and CPW3*n*. The unit cells 5*a*-1 to 5*a*-N are arranged along the transmission lines CPW1, CPW2*p*, CPW2*n*, CPW3*p*, and CPW3*n*. Each of the unit cells has the IF input terminal connected to the transmission line CPW1, the LO input terminal connected to the transmission lines CPW3*p* and CPW3*n*, and the RF output terminal connected to the transmission lines CPW2*p* and CPW2*n*. The bias tee 4 supplies a bias voltage to an input transistor of each of the unit cells 5*a*-1 to 5*a*-N.

The branch waveguide 6 branches an LO signal into two signals to apply them to input ends of the transmission lines CPW3*p* and CPW3*n*.

In FIG. 5, Vin denotes an input signal (IF signal) for the distributed mixer, Vout+ denotes a positive output signal (RF+ signal) from the distributed mixer, Vout− denotes a negative output signal (RF− signal) from the distributed mixer, LO+ denotes a positive LO signal, and LO− denotes a negative LO signal.

Figure 6:
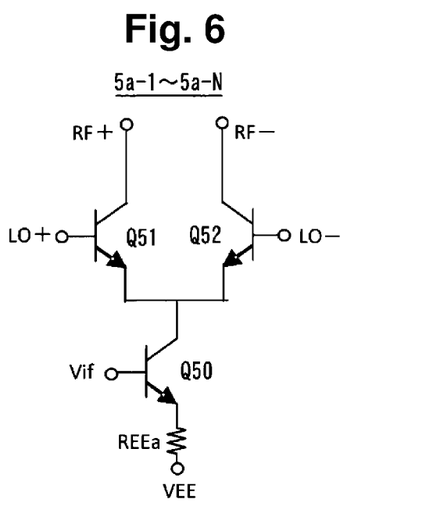
FIG. 6 is a circuit diagram showing a configuration of a unit cell of the distributed mixer according to the second embodiment of the present invention.

As shown in FIG. 6, each of the unit cells 5*a* (5*a*-1 to 5*a*-N) includes an input transistor Q50, output transistors Q51 and Q52, and an emitter resistor REEa.

Here, the input transistor Q50 has a base terminal connected to the transmission line CPW1. The output transistors Q51 and Q52 have base terminals connected to the transmission lines CPW3*p* and CPW3*n*, collector terminals connected to the transmission lines CPW2*p* and CPW2*n*, and emitter terminals connected to a collector terminal of the transistor Q50. The emitter resistor REEa has one end connected to an emitter terminal of the input transistor Q50 and the other end connected to the power supply voltage VEE.

In the conventional distributed mixer, as described above, the emitter resistor REE of the input transistor Q50 of each of the unit cells 5 has the same resistance value. On the other hand, in the present embodiment, the emitter resistor REEa of the input transistor Q50 of each of the unit cells 5*a* is set, in order for a collector current of each of the unit cells 5*a* to have a uniform value, to a different resistance value from each other, specifically, to a larger resistance value as the corresponding unit cell is closer to the bias tee 4 and to a smaller resistance value as the corresponding unit cell is closer to the input termination resistor R1.

Figure 7:
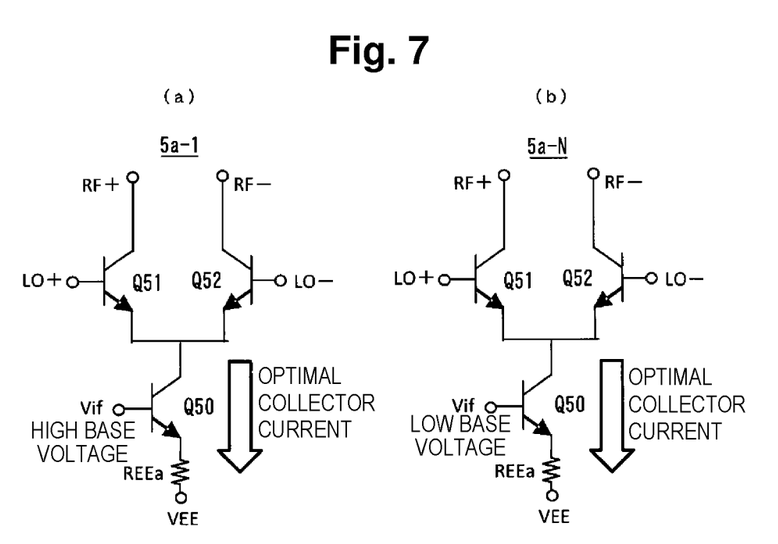
FIG. 7 is a diagram for describing an effect of the distributed mixer according to the second embodiment of the present invention.

This allows, even if the base voltages Vif of the input transistors Q50 of the unit cells 5a have non-uniform values as shown in examples (a) and (b) of FIG. 7, the collector current flowing through the input transistor Q50 of each of the unit cells 5a to have an almost same value, and to have an optimal value.

The present inventors simulated the conventional distributed mixer shown in FIGS. 13 and 14 and the distributed mixer of the present embodiment shown in FIGS. 5 and 6. Here, N=6 was set for both the conventional and present embodiments. All the unit cells 5 (5-1 to 5-6) of the conventional distributed mixer include the emitter resistors REE of 15Ω. On the other hand, the distributed mixer of the present embodiment includes, in order from closest to the bias tee 4, the emitter resistors REEa having resistance values of: 15Ω for the unit cell 5a-1 in the first stage; 14.5Ω for the unit cell 5a-2 in the second stage; 14Ω for the unit cell 5a-3 in the third stage; 13.5Ω for the unit cell 5a-4 in the fourth stage; 12Ω for the unit cell 5a-5 in the fifth stage; and 10.5Ω for the unit cell 5a-6 in the sixth stage.

In the conventional distributed mixer, the collector current of the unit cell 5-6 in the sixth stage is 22% smaller than that of the unit cell 5-1 in the first stage. On the other hand, in the distributed mixer of the present embodiment, the differences in the collector currents among all unit cells fall within 1%.

Figure 8:
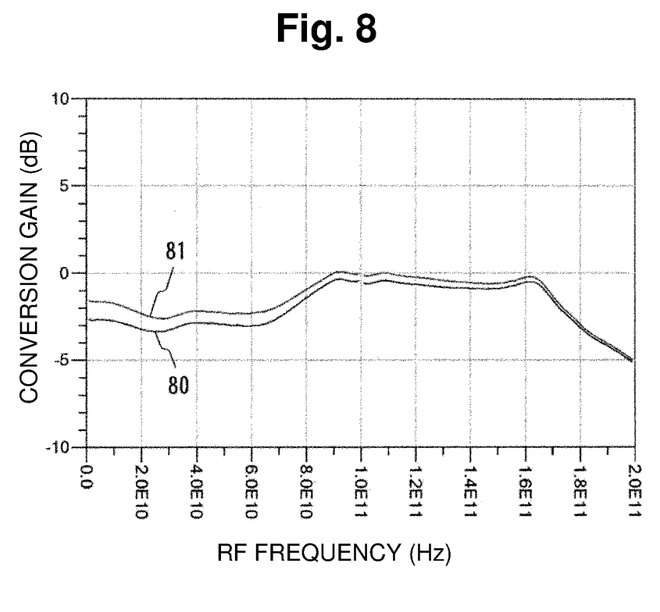
FIG. 8 is a diagram showing simulation results of conversion gains of distributed mixers according to the prior art and the second embodiment of the present invention.

FIG. 8 shows the simulation results of conversion gains of the distributed mixers of the conventional and present embodiments. The frequencies of the IF signals range from DC to 100 GHz and the frequency of the LO signal is 100 GHz. The distributed mixer is a double-sideband mixer, and the RF signals after frequency conversion have signal bandwidths: an upper sideband (100 GHz to 200 GHz) and a lower sideband (DC to 100 GHz). In FIG. 8, reference numeral 80 denotes the conversion gain of the conventional distributed mixer, and reference numeral 81 denotes the conversion gain of the distributed mixer of the present embodiment. The conventional distributed mixer has the conversion gain of −3.3 dB at the RF frequency of 20 GHz, but the distributed mixer of the present embodiment is able to have the conversion gain improved to −2.3 dB.

In the first and second embodiments, the input termination resistor R1 is connected to the power supply voltage VEE (the first voltage, which is a negative voltage), thus the bias voltage vbin is higher than the power supply voltage VEE. Accordingly, a current I flows from the inductor L1 of the bias tee 4 toward the input termination resistor R1 through the transmission line CPW1 as shown in FIGS. 1 and 5.

On the other hand, with the input termination resistor R1 being connected to the ground voltage (first voltage), the ground voltage is higher than the bias voltage vbin, so that a current flows from the input termination resistor R1 toward the inductor L1 of the bias tee 4 through the transmission line CPW1. In this case, the emitter resistors REEa of the input transistors Q30 and Q50 of the unit cells 3a and 5a are set to smaller resistance values as the respective unit cells are closer to the bias tee 4 and to larger resistance values as the respective unit cells are closer to the input termination resistor R1.

Further, in the first and second embodiments, the examples of the distributed circuit are described with reference to FIGS. 1 and 5 but circuit configurations are not limited to those shown in FIG. 1 and FIG. 5 as long as a distributed circuit sets an emitter resistor of an input transistor of each of a plurality of unit cells to a different and appropriate resistance value from each other to compensate for the non-uniformity of a corresponding current.

Further, the first and second embodiments show the examples in which bipolar transistors are used as transistors Q30, Q31, and Q50 to Q52 but field effect transistors may be used. For the field effect transistors, the following replacements may be done in the above description: to replace a base terminal with a gate terminal, a collector terminal with a drain terminal, an emitter terminal with a source terminal, and an emitter resistor with a source resistor.

INDUSTRIAL APPLICABILITY

Embodiments of the present invention are applicable to distributed circuits.

REFERENCE SIGNS LIST

1 Signal input terminal
2, 2p, 2n Signal output terminal
3a, 5a Unit cell
4 Bias tee
CPW1, CPW2, CPW2p, CPW2n, CPW3p, CPW3n Transmission line
Q30, Q31, Q50 to Q52 Transistor
R1, R2p, R2n, R3p, R3n, R30, R31, REEa Resistor
C1, C30 Capacitor
L1 Inductor

The invention claimed is:

1. A distributed circuit comprising:
a first transmission line configured to receive an input signal at an input end;
a second transmission line configured to output an output signal from an output end;
a termination resistor connected to a line end of the first transmission line;
a plurality of unit cells arranged along the first and second transmission lines, the unit cells having input terminals connected to the first transmission line and output terminals connected to the second transmission line, wherein each of the unit cells comprises:
an input transistor having a base terminal connected to the first transmission line; and
an emitter resistor connected to an emitter terminal of the input transistor; and
a bias tee connected to the input end of the first transmission line, the bias tee configured to supply a bias voltage to the input transistor of each of the unit cells, wherein the emitter resistor of each of the unit cells is set to a different resistance value from each other, the different resistance value being set based on a distance between the respective unit cell and the bias tee, so that a collector current flowing through the input transistor of each of the unit cells has a uniform value.

2. The distributed circuit according to claim 1, wherein when a current flows from the bias tee toward the termination resistor through the first transmission line, the emitter resistor of each of the unit cells is set to a larger resistance value as the corresponding unit cell is closer to the bias tee and to a smaller resistance value as the corresponding unit cell is closer to the termination resistor.

3. The distributed circuit according to claim 1, wherein when a current flows from the termination resistor toward the bias tee through the first transmission line, the emitter resistor of each of the unit cells is set to a smaller resistance value as the corresponding unit cell is closer to the bias tee and to a larger resistance value as the corresponding unit cell is closer to the termination resistor.

4. The distributed circuit according to claim 1, wherein each of the unit cells further comprises:
the emitter resistor having a first end connected to the emitter terminal of the input transistor and a second end connected to a first voltage; and
an output transistor having a base terminal connected to a second voltage, a collector terminal connected to the second transmission line, and an emitter terminal connected to the collector terminal of the input transistor; and
wherein the distributed circuit is configured to operate as a distributed amplifier.

5. The distributed circuit according to claim 1, wherein the input signal is an intermediate frequency (IF) signal and the output signal is a radio frequency (RF) signal, and the distributed circuit further comprises a third transmission line configured to receive a local oscillator (LO) signal at an input end.

6. The distributed circuit according to claim 5, wherein each of the unit cells further comprises:
an output transistor having a base terminal connected to the third transmission line, a collector terminal connected to the second transmission line, and an emitter terminal connected to the collector terminal of the input transistor; and
the emitter resistor having a first end connected to the emitter terminal of the input transistor and a second end connected to a first voltage; and
wherein the distributed circuit is configured to operate as a distributed mixer.

7. The distributed circuit according to claim 1, wherein the bias tee comprises:
a capacitor having a first end configured to receive the input signal and a second end connected to the input end of the first transmission line; and
an inductor having a first end connected to the input end of the first transmission line and a second end connected to a third voltage.

8. A distributed circuit comprising:
a first transmission line configured to receive an input signal at an input end;
a second transmission line configured to output an output signal from an output end;
a termination resistor connected to a line end of the first transmission line;
a plurality of unit cells arranged along the first and second transmission lines, the unit cells having input terminals connected to the first transmission line and output terminals connected to the second transmission line, wherein each of the unit cells comprises:
an input transistor having a gate terminal connected to the first transmission line; and
a source resistor connected to a source terminal of the input transistor; and
a bias tee connected to the input end of the first transmission line, the bias tee configured to supply a bias voltage to the input transistor of each of the unit cells, wherein the source resistor of each of the unit cells is set to a different resistance value from each other, the different resistance value being set based on a distance between the respective unit cell and the bias tee, so that a drain current flowing through the input transistor of each of the unit cells has a uniform value.

9. The distributed circuit according to claim 8, wherein when a current flows from the bias tee toward the termination resistor through the first transmission line, the source resistor of each of the unit cells is set to a larger resistance value as the corresponding unit cell is closer to the bias tee and to a smaller resistance value as the corresponding unit cell is closer to the termination resistor.

10. The distributed circuit according to claim 8, wherein when a current flows from the termination resistor toward the bias tee through the first transmission line, the source resistor of each of the unit cells is set to a smaller resistance value as the corresponding unit cell is closer to the bias tee and to a larger resistance value as the corresponding unit cell is closer to the termination resistor.

11. The distributed circuit according to claim 8, wherein each of the unit cells further comprises:
the source resistor having a first end connected to the source terminal of the input transistor and a second end connected to a first voltage; and
an output transistor having a gate terminal connected to a second voltage, a drain terminal connected to the second transmission line, and a source terminal connected to the drain terminal of the input transistor; and
wherein the distributed circuit is configured to operate as a distributed amplifier.

12. The distributed circuit according to claim 8, wherein the input signal is an intermediate frequency (IF) signal and the output signal is a radio frequency (RF) signal, and the distributed circuit further comprises a third transmission line configured to receive a local oscillator (LO) signal at an input end.

13. The distributed circuit according to claim 12, wherein each of the unit cells further comprises:
an output transistor having a gate terminal connected to the third transmission line, a drain terminal connected to the second transmission line, and a source terminal connected to the drain terminal of the input transistor; and
the source resistor having a first end connected to the source terminal of the input transistor and a second end connected to a first voltage; and
wherein the distributed circuit is configured to operate as a distributed mixer.

14. The distributed circuit according to claim 8, wherein the bias tee comprises:
a capacitor having a first end configured to receive the input signal and a second end connected to the input end of the first transmission line; and
an inductor having a first end connected to the input end of the first transmission line and a second end connected to a third voltage.

* * * * *